United States Patent
Nakanishi (10) Patent No.: US 9,871,503 B2
(45) Date of Patent: Jan. 16, 2018

(54) SEMICONDUCTOR INTEGRATED CIRCUIT, LATCH CIRCUIT, AND FLIP-FLOP CIRCUIT

(71) Applicant: PANASONIC INTELLECTUAL PROPERTY MANAGEMENT CO., LTD., Osaka (JP)

(72) Inventor: Kazuyuki Nakanishi, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 15/665,070

(22) Filed: Jul. 31, 2017

(65) Prior Publication Data

US 2017/0331464 A1 Nov. 16, 2017

Related U.S. Application Data

(63) Continuation of application No. 15/188,616, filed on Jun. 21, 2016, now Pat. No. 9,755,622, which is a
(Continued)

(30) Foreign Application Priority Data

Dec. 27, 2013 (JP) ................. 2013-273257

(51) Int. Cl.
*H03K 3/356* (2006.01)
*H03K 3/012* (2006.01)
*H03K 3/037* (2006.01)

(52) U.S. Cl.
CPC ....... *H03K 3/356121* (2013.01); *H03K 3/012* (2013.01); *H03K 3/037* (2013.01); *H03K 3/35606* (2013.01); *H03K 3/356026* (2013.01)

(58) Field of Classification Search
CPC .. H03K 3/356121; H03K 3/012; H03K 3/037; H03K 3/356026; H03K 3/35606
(Continued)

(56) References Cited

U.S. PATENT DOCUMENTS 5,111,076 A 5/1992 Tarng
5,194,764 A 3/1993 Yano et al.
(Continued)

FOREIGN PATENT DOCUMENTS

JP 06-077805 A 3/1994
JP H06-164331 A 6/1994
(Continued)

OTHER PUBLICATIONS

International Search Report and Written Opinion issued in corresponding International Patent Application No. PCT/JP2014/006180, dated Mar. 17, 2015; with English translation.
(Continued)

*Primary Examiner* — Ryan Jager
(74) *Attorney, Agent, or Firm* — McDermott Will & Emery LLP (57) ABSTRACT

A semiconductor integrated circuit connected between a first node and a second node includes first to fourth transistors. When a signal at the second node changes, the fourth transistor is turned on, and a potential obtained by shifting a third potential by the threshold of the fourth transistor is applied to the gate of the second transistor.

5 Claims, 10 Drawing Sheets

Related U.S. Application Data continuation of application No. PCT/JP2014/006180, filed on Dec. 11, 2014.

(58) Field of Classification Search
USPC .......................................................... 327/211
See application file for complete search history.

(56) References Cited

U.S. PATENT DOCUMENTS

| | | | | |
|---|---|---|---|---|
| 5,349,246 | A * | 9/1994 | McClure | H03K 3/3565 |
| | | | | 326/121 |
| 5,552,719 | A | 9/1996 | Murakami | |
| 5,633,603 | A | 5/1997 | Lee | |
| 5,812,002 | A | 9/1998 | Yoshida | |
| 6,008,678 | A | 12/1999 | Barber | |
| 6,104,234 | A * | 8/2000 | Shin | G05F 3/205 |
| | | | | 327/534 |
| 6,285,227 | B1 | 9/2001 | Takahashi et al. | |
| 6,480,034 | B1 * | 11/2002 | Matsudera | H03K 19/00315 |
| | | | | 326/112 |
| 6,763,079 | B1 * | 7/2004 | Iwamoto | G01R 31/31725 |
| | | | | 327/156 |
| 7,212,062 | B2 * | 5/2007 | Sperling | H03K 17/162 |
| | | | | 326/105 |
| 2003/0011415 | A1 | 1/2003 | Kawamura | |
| 2003/0214361 | A1 * | 11/2003 | Nishikido | H03K 3/0231 |
| | | | | 331/57 |
| 2006/0082404 | A1 | 4/2006 | Ishii et al. | |
| 2009/0039937 | A1 | 2/2009 | Ishii et al. | |
| 2015/0116042 | A1 * | 4/2015 | Kim | H03K 3/011 |
| | | | | 331/57 |

FOREIGN PATENT DOCUMENTS

| | | |
|---|---|---|
| JP | H08-316822 A | 11/1996 |
| JP | 09-008612 A | 1/1997 |
| JP | 10-093397 A | 4/1998 |
| JP | 2000-278098 A | 10/2000 |
| JP | 2002-026718 A | 1/2002 |
| JP | 2004-080172 A | 3/2004 |
| JP | 3572700 B2 | 10/2004 |
| JP | 2006-115311 A | 4/2006 |

OTHER PUBLICATIONS

Non-Final Office Action issued in U.S. Appl. No. 15/188,616, dated Jan. 11, 2017.
Notice of Allowance issued in U.S. Appl. No. 15/188,616, dated May 3, 2017.

* cited by examiner

SEMICONDUCTOR INTEGRATED CIRCUIT, LATCH CIRCUIT, AND FLIP-FLOP CIRCUIT

CROSS REFERENCE TO RELATED APPLICATION

This application is a continuation of U.S. application Ser. No. 15/188,616 filed on Jun. 21, 2016, which is a U.S. continuation application of PCT International Patent Application Number PCT/JP2014/006180 filed on Dec. 11, 2014, claiming the benefit of priority of Japanese Patent Application Number 2013-273257 filed on Dec. 27, 2013, the entire contents of which are hereby incorporated by reference.

BACKGROUND OF THE INVENTION

1. Technical Field

The present disclosure relates to a semiconductor integrated circuit, and a latch circuit and flip-flop circuit including the semiconductor integrated circuit.

2. Description of the Related Art

A large number of latch circuits and flip-flop circuits are used in semiconductor integrated circuits. The widespread use of mobile devices has led to growing demand for semiconductor integrated circuits that consume less power, and reductions in power consumption of latch circuits and flip-flop circuits have been increasingly desired.

Typically, to reduce the power consumption of a latch circuit or flip-flop circuit, it is desirable to minimize the number of transistors on the clock signal propagation path. For example, writing a data signal to a latch is eased if there is a mechanism of temporarily interrupting a latch feedback signal according to a clock signal. On the other hand, the number of transistors on the clock signal propagation path can be reduced by omitting a control switch that serves as such an interruption mechanism.

For example, Patent Literature (PTL) 1 (Japanese Patent Publication No. 3572700 (FIG. 3)) and PTL 2 (the specification of U.S. Pat. No. 6,008,678) disclose the techniques of, in each of a master latch circuit and a slave latch circuit constituting a flip-flop circuit, omitting the above-mentioned control switch and generating a latch feedback signal only by an inverter.

SUMMARY

A reduction in power voltage in response to recent demand for lower-power-consumption semiconductor integrated circuits or a reduction in transistor size in response to recent demand for smaller-area semiconductor integrated circuits causes lower drive capability of a transistor for writing a data signal. With the conventional techniques described in PTL 1 and PTL 2, the data signal may be unable to be written due to the drive capability of the transistor for writing the data signal being lower than the drive capability of the inverter for generating the latch feedback signal. Extremely lowering the drive capability of the inverter, however, makes it impossible to hold the latch signal.

The present disclosure provides a technique of effectively reducing power consumption while ensuring the operation of writing to the semiconductor integrated circuit and the data holding capability, even in the case where the power voltage decreases or the drive capability of the transistor decreases.

One aspect of the present disclosure is a semiconductor integrated circuit connected between first and second nodes to which respective signals inverted from each other are applied. The semiconductor integrated circuit includes: a first transistor of a first conductivity type located between a first potential node to which a first potential is applied and the first node; a second transistor of a second conductivity type located between the first node and a second potential node to which a second potential is applied, and having a drain connected to the first node; and a third transistor having a source connected to a gate of the second transistor. When a signal at the second node changes, a third potential for turning on the third transistor is applied to a gate of the third transistor, and a potential obtained by shifting the third potential by a threshold of the third transistor is applied to the gate of the second transistor.

In the semiconductor integrated circuit according to one aspect of the present disclosure, when the signal at the second node changes (transitions from high to low or from low to high), the third potential (for example, the second potential in the case where the third transistor is of the first conductivity type, or the first potential in the case where the third transistor is of the second conductivity type) is applied to the gate of the third transistor, to turn on the third transistor. Then, the potential obtained by shifting, by the threshold of the third transistor, the third potential applied to the gate of the third transistor is applied to the gate of the second transistor. The application of the potential shifted by the threshold means that a predetermined potential between the first potential and the second potential is applied to the gate of the second transistor, so that the second transistor is weakly on. Since the second transistor is weakly on, the drive capability of the second transistor is sufficiently weak when the signal level at the first node transitions. This eases the transition of the signal level at the first node.

According to one aspect of the present disclosure, power consumption can be reduced while ensuring the operation of writing to the semiconductor integrated circuit and the data holding capability, even in the case where the power voltage decreases or the drive capability of the transistor decreases.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Each of the embodiments described below shows a general or specific example. The numerical values, shapes, materials, structural elements, the arrangement and connection of the structural elements, steps, the processing order of the steps, etc. shown in the following embodiments are mere examples, and do not limit the scope of the present disclosure. Of the structural elements in the following embodiments, structural elements not recited in any one of the independent claims representing superordinate concepts are described as optional structural elements.

The embodiments according to the present disclosure are described in detail below, with reference to drawings. The repeated description of the substantially same structures may be omitted.

Embodiment 1

Figure 1A:
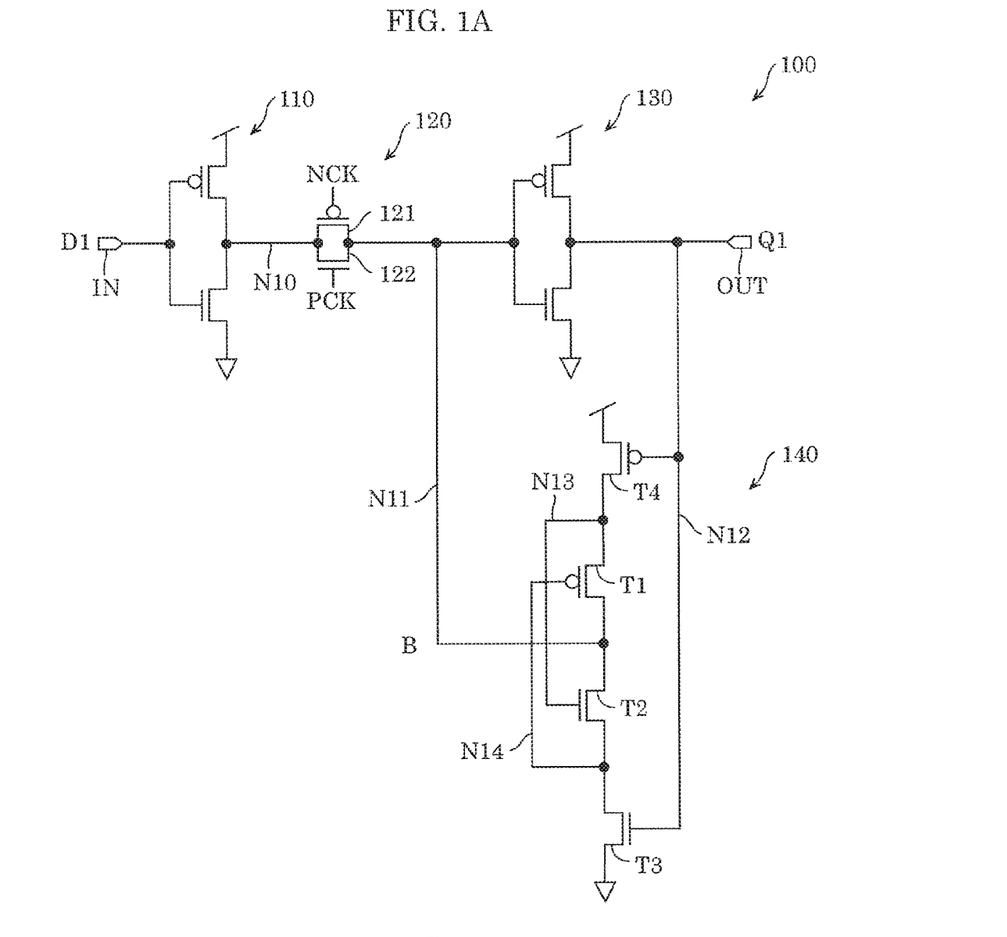
FIG. 1A is a conceptual diagram of a latch circuit according to Embodiment 1.
Figure 1B:
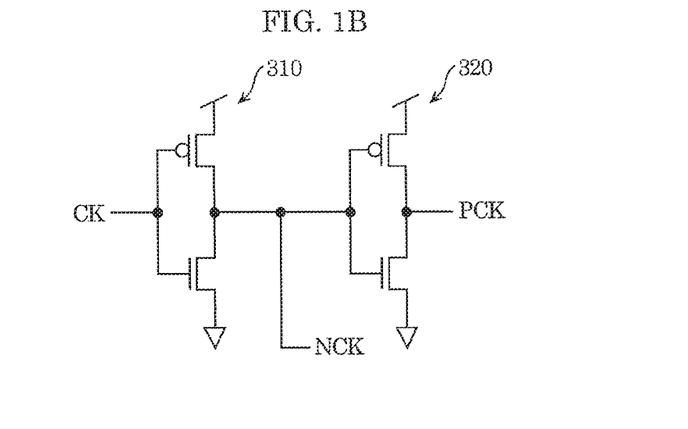
FIG. 1B is a conceptual diagram of a circuit that processes a clock signal in the latch circuit according to Embodiment 1.

FIG. 1A is a circuit diagram illustrating an example of a latch circuit according to Embodiment 1. FIG. 1B is a conceptual diagram of a circuit that processes a clock signal in the latch circuit according to Embodiment 1.

As illustrated in FIG. 1A, latch circuit 100 includes: two inverters 110 (first inverter) and 130 (second inverter) connected in series between input terminal IN and output terminal OUT; control switch 120 located between inverters 110 and 130; and latch feedback unit 140 (semiconductor integrated circuit) that receives latch signal Q1 output from output terminal OUT, generates latch feedback signal B, and feeds back latch feedback signal B to the input of inverter 130. The output of inverter 110 and the input of control switch 120 are connected by node N10. The output of control switch 120, the input of inverter 130, and the output of latch feedback unit 140 are connected by node N11 as a first node. The output of inverter 130, output terminal OUT, and the input of latch feedback unit 140 are connected by node N12 as a second node. Thus, signals inverted from each other are applied to nodes N11 and N12.

Control switch 120 is a switch having a function of interrupting or transmitting data signal D1 (input signal), and includes P-type transistor 121 and N-type transistor 122 connected in parallel between nodes N10 and N11. Clock internal inverted signal NCK obtained by inverting clock signal CK by inverter 310 as illustrated in FIG. 1B is applied to the gate of P-type transistor 121. Clock internal signal PCK obtained by inverting clock internal inverted signal NCK by inverter 320 as illustrated in FIG. 1B is applied to the gate of N-type transistor 122.

Latch feedback unit 140 includes: P-type transistor T4 (first transistor) having a source connected to a power (first potential node) and a gate connected to node N12; P-type transistor T1 (fourth transistor) connected between node N13 to which the drain of P-type transistor T4 is connected and node N11; N-type transistor T2 (second transistor) having a drain connected to node N11 and a gate connected to node N13; and N-type transistor T3 (third transistor) connected between node N14 (third node) to which the source of N-type transistor T2 is connected and a ground (second potential node), and having a gate connected to node N12. The gate of P-type transistor T1 is connected to node N14. With such a structure, latch feedback unit 140 and inverter 130 realize a latch function, and latch circuit 100 receives data signal D1 from input terminal IN and outputs latch signal Q1 to output terminal OUT. Latch circuit 100 has no control switch for interrupting or transmitting latch feedback signal B.

The following describes the operation of latch circuit 100 according to Embodiment 1 in detail.

First, when clock signal CK is low, control switch 120 interrupts data signal D1. In this case, when latch signal Q1 is high and latch feedback signal B is low, P-type transistor T4 (first transistor) is off and N-type transistor T3 (third transistor) is on. Accordingly, P-type transistor T1 (fourth transistor) is turned on, and the potential obtained by increasing (shifting) the potential (low potential) of latch feedback signal B by the threshold of P-type transistor T1 is applied to the gate of N-type transistor T2 (second transistor). This causes N-type transistor T2 to be weakly on, enabling latch feedback signal B and latch signal Q1 to be held.

Next, when clock signal CK transitions from low to high, control switch 120 transmits data signal D1. In this case, when data signal D1 transitions from high to low, the drive capability of N-type transistor T2 is sufficiently weak relative to inverter 110, so that latch feedback signal B can easily transition from low to high even if the drive capability of inverter 110 decreases due to a decrease in power potential VDD or the like. Hence, latch circuit 100 can write data signal D1 to latch signal Q1.

On the other hand, when latch signal Q1 is low and latch feedback signal B is high in the case where clock signal CK is low, N-type transistor T3 is off and P-type transistor T4 is on. Accordingly, N-type transistor T2 is turned on, and the potential obtained by decreasing (shifting) latch feedback signal B (high potential) by the threshold of N-type transistor T2 is applied to the gate of P-type transistor T1. This causes P-type transistor T1 to be weakly on, enabling latch feedback signal B and latch signal Q1 to be held.

Next, when clock signal CK transitions from low to high, control switch 120 transmits data signal D1. In this case, when data signal D1 transitions from low to high, the drive capability of P-type transistor T1 is sufficiently weak relative to inverter 110, so that latch feedback signal B can easily transition from high to low even if the drive capability of inverter 110 decreases due to a decrease in power potential VDD or the like. Hence, latch circuit 100 can write data signal D1 to latch signal Q1.

As described above, latch circuit 100 according to this embodiment ensures the operation of writing to the latch circuit and the holding capability without any control function of interrupting or transmitting latch feedback signal B. Thus, the power consumption of the latch circuit can be reduced while ensuring the operation of writing to the latch circuit and the data holding capability.

In other words, the semiconductor integrated circuit according to Embodiment 1 of the present disclosure is a semiconductor integrated circuit connected between a first node and a second node, and includes: a first transistor of a first conductivity type (P-type transistor) located between a first potential node to which a first potential (power potential VDD) is applied and the first node, and having a gate connected to the second node; a second transistor of a second conductivity type (N-type transistor) having a drain connected to the first node; a third transistor of the second conductivity type located between a third node connected to a source of the second transistor and a second potential node to which a second potential (ground potential VSS) is applied, and having a gate connected to the second node; and a fourth transistor having a source or a drain connected to a gate of the second transistor. When a signal at the second node changes, a third potential for turning on the fourth transistor is applied to a gate of the fourth transistor, and a potential obtained by shifting the third potential by a threshold of the fourth transistor is applied to a gate of the second transistor.

In the semiconductor integrated circuit according to Embodiment 1, when the signal at the second node changes (transitions from high to low or from low to high), the third potential (for example, the second potential in the case where the fourth transistor is of the first conductivity type, or the first potential in the case where the fourth transistor is of the second conductivity type) is applied to the gate of the fourth transistor, to turn on the fourth transistor. Then, the potential obtained by shifting, by the threshold of the fourth transistor, the third potential applied to the gate of the fourth transistor is applied to the gate of the second transistor. The application of the potential shifted by the threshold means that a predetermined potential between the first potential and the second potential is applied to the gate of the second transistor, so that the second transistor is weakly on. Since the second transistor is weakly on, the drive capability of the second transistor is sufficiently weak when the signal level at the first node transitions. This eases the transition of the signal level at the first node.

Therefore, in the case where the semiconductor integrated circuit according to Embodiment 1 is applied to, for example, a latch circuit or a flip-flop circuit, the second transistor is weakly on, and so the latch signal (output signal) and the signal fed back from the latch feedback unit can be held. Moreover, when the signal level at the first node transitions (from high to low or from low to high), the drive capability of the second transistor is sufficiently weak, which eases the transition of the signal level at the first node. This ensures the operation of writing to the latch circuit and the holding capability without any control function of interrupting or transmitting the signal fed back from the latch feedback unit. Thus, power consumption can be reduced while ensuring the operation of writing to the latch circuit or flip-flop circuit and the data holding capability.

Embodiment 2

Figure 2A:
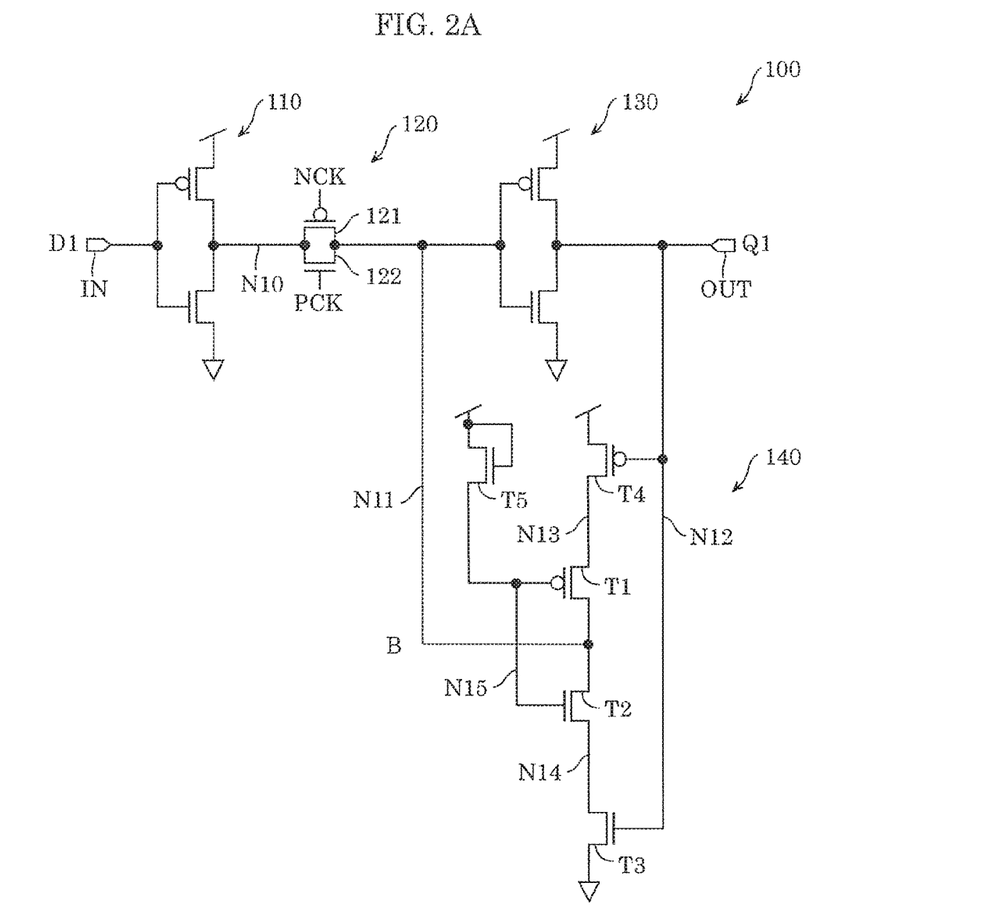
FIG. 2A is a conceptual diagram of a latch circuit according to Embodiment 2.
Figure 2B:
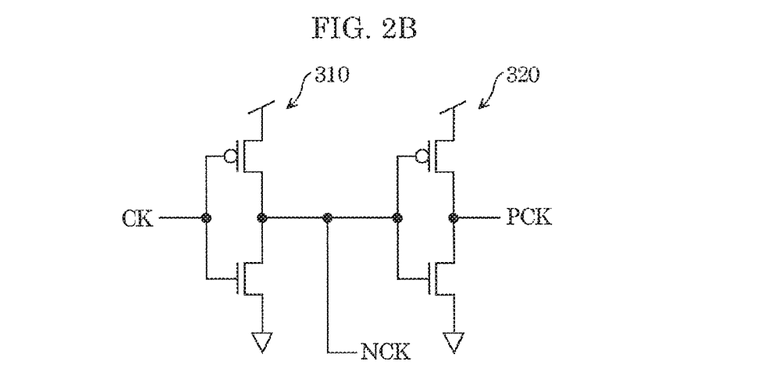
FIG. 2B is a conceptual diagram of a circuit that processes a clock signal in the latch circuit according to Embodiment 2.

FIG. 2A is a circuit diagram illustrating an example of a latch circuit according to Embodiment 2. In FIG. 2A, the structural elements other than latch feedback unit 140 are the same as or similar to those in FIG. 1A. FIG. 2B is a conceptual diagram of a circuit that processes a clock signal in the latch circuit according to Embodiment 2, and illustrates the same circuit as in FIG. 1B.

As illustrated in FIG. 2A, latch feedback unit 140 includes: N-type transistor T5 (fourth transistor) having a gate and drain connected to the power; P-type transistor T4 (first transistor) having a source connected to the power and a gate connected to node N12; P-type transistor T1 (fifth transistor) connected between node N13 to which the drain of P-type transistor T4 is connected and node N11, and having a gate connected to the source of N-type transistor T5 via node N15; N-type transistor T2 (second transistor) having a drain connected to node N11 and a gate connected to node N15; and N-type transistor T3 (third transistor) connected between node N14 to which the source of N-type transistor T2 is connected and the ground, and having a gate connected to node N12. With such a structure, latch feedback unit 140 and inverter 130 realize a latch function, and latch circuit 100 receives data signal D1 from input terminal IN and outputs latch signal Q1 to output terminal OUT, as in FIG. 1A. Latch circuit 100 has no control switch for interrupting or transmitting latch feedback signal B.

The following describes the operation of latch circuit 100 according to Embodiment 2 in detail.

First, when clock signal CK is low, control switch 120 interrupts data signal D1. In this case, when latch signal Q1 is high and latch feedback signal B is low, P-type transistor T4 (first transistor) is off and N-type transistor T3 (third transistor) is on. Since power potential VDD is applied to the gate and drain of N-type transistor T5 (fourth transistor), the potential obtained by decreasing (shifting) power potential VDD by the threshold of N-type transistor T5 is applied to the gate of N-type transistor T2 (second transistor). This causes N-type transistor T2 to be weakly on, enabling latch feedback signal B and latch signal Q1 to be held.

Next, when clock signal CK transitions from low to high, control switch 120 transmits data signal D1. In this case, when data signal D1 transitions from high to low, the drive capability of N-type transistor T2 is sufficiently weak relative to inverter 110, so that latch feedback signal B can easily transition from low to high even if the drive capability of inverter 110 decreases due to a decrease in power potential VDD or the like. Hence, latch circuit 100 can write data signal D1 to latch signal Q1.

On the other hand, when latch signal Q1 is low and latch feedback signal B is high in the case where clock signal CK is low, N-type transistor T3 is off and P-type transistor T4 is on. Since power potential VDD is applied to the gate and drain of N-type transistor T5, the potential obtained by decreasing (shifting) power potential VDD by the threshold of N-type transistor T5 is applied to the gate of P-type transistor T1. This causes P-type transistor T1 to be weakly on, enabling latch feedback signal B and latch signal Q1 to be held.

Next, when clock signal CK transitions from low to high, control switch 120 transmits data signal D1. In this case, when data signal D1 transitions from low to high, the drive capability of P-type transistor T1 is sufficiently weak relative to inverter 110, so that latch feedback signal B can easily transition from high to low even if the drive capability of inverter 110 decreases due to a decrease in power potential VDD or the like. Hence, latch circuit 100 can write data signal D1 to latch signal Q1.

As described above, latch circuit 100 according to this embodiment ensures the operation of writing to the latch circuit and the holding capability without any control function of interrupting or transmitting latch feedback signal B. Thus, the power consumption of the latch circuit can be reduced while ensuring the operation of writing to the latch circuit and the data holding capability.

Embodiment 3

Figure 3A:
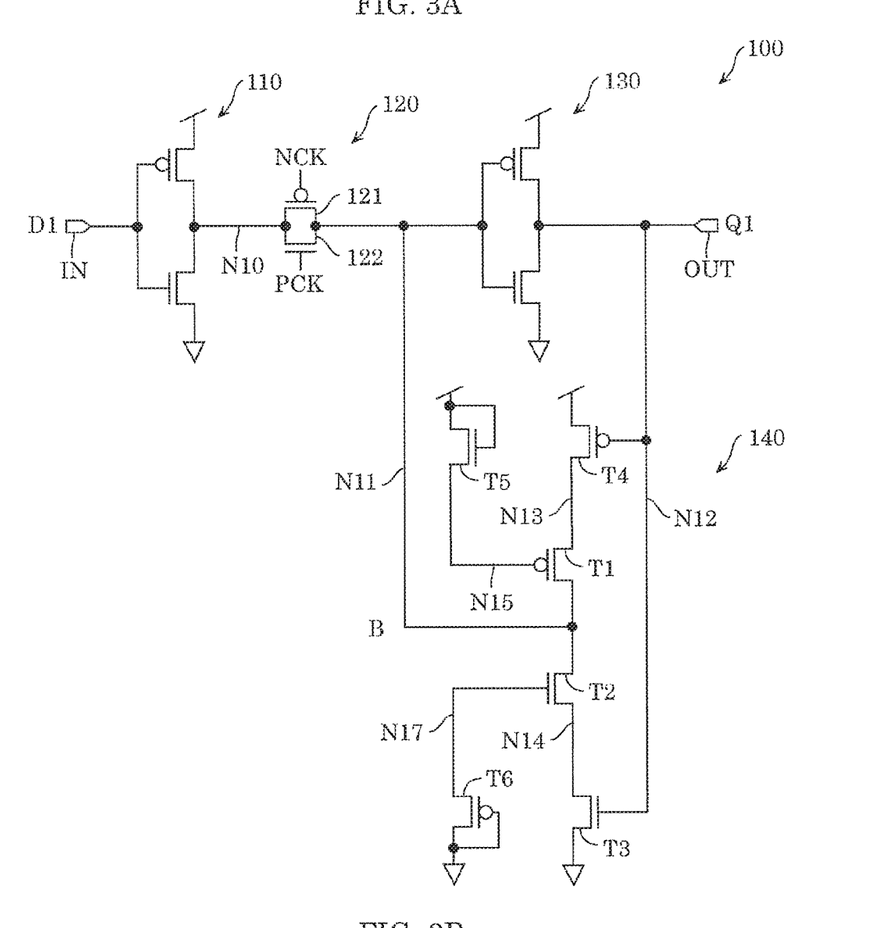
FIG. 3A is a conceptual diagram of a latch circuit according to Embodiment 3.
Figure 3B:
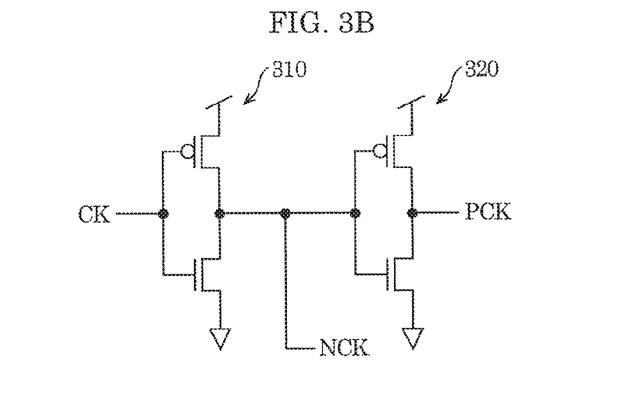
FIG. 3B is a conceptual diagram of a circuit that processes a clock signal in the latch circuit according to Embodiment 3.

FIG. 3A is a circuit diagram illustrating an example of a latch circuit according to Embodiment 3. In FIG. 3A, the structural elements other than latch feedback unit 140 are the same as or similar to those in FIG. 1A. Latch feedback unit 140 in FIG. 3A differs from the structure in FIG. 2A in that the gate of N-type transistor T2 (second transistor) and the source of N-type transistor T5 (sixth transistor) are not connected, and P-type transistor T6 (fourth transistor) having a gate and drain connected to the ground and a source connected to the gate of N-type transistor T2 is further included. FIG. 3B is a conceptual diagram of a circuit that processes a clock signal in the latch circuit according to Embodiment 3, and illustrates the same circuit as in FIG. 1B.

With such a structure, latch feedback unit 140 and inverter 130 realize a latch function, and latch circuit 100 receives data signal D1 from input terminal IN and outputs latch signal Q1 to output terminal OUT, as in FIG. 1A. Latch circuit 100 has no control switch for interrupting or transmitting latch feedback signal B.

The following describes the operation of latch circuit 100 according to Embodiment 3 in detail.

First, when clock signal CK is low, control switch 120 interrupts data signal D1. In this case, when latch signal Q1 is high and latch feedback signal B is low, P-type transistor T4 (first transistor) is off and N-type transistor T3 (third transistor) is on. Since ground potential VSS is applied to the gate and drain of P-type transistor T6 (fourth transistor), the potential obtained by increasing (shifting) ground potential VSS by the threshold of P-type transistor T6 is applied to the gate of N-type transistor T2 (second transistor). This causes N-type transistor T2 to be weakly on, enabling latch feedback signal B and latch signal Q1 to be held.

Next, when clock signal CK transitions from low to high, control switch 120 transmits data signal D1. In this case, when data signal D1 transitions from high to low, the drive capability of N-type transistor T2 is sufficiently weak relative to inverter 110, so that latch feedback signal B can easily transition from low to high even if the drive capability of inverter 110 decreases due to a decrease in power potential VDD or the like. Hence, latch circuit 100 can write data signal D1 to latch signal Q1.

On the other hand, when latch signal Q1 is low and latch feedback signal B is high in the case where clock signal CK is low, N-type transistor T3 is off and P-type transistor T4 is on. Since power potential VDD is applied to the gate and drain of N-type transistor T5, the potential obtained by decreasing power potential VDD by the threshold of N-type transistor T5 is applied to the gate of P-type transistor T1. This causes P-type transistor T1 to be weakly on, enabling latch feedback signal B and latch signal Q1 to be held.

Next, when clock signal CK transitions from low to high, control switch 120 transmits data signal D1. In this case, when data signal D1 transitions from low to high, the drive capability of P-type transistor T1 is sufficiently weak relative to inverter 110, so that latch feedback signal B can easily transition from high to low even if the drive capability of inverter 110 decreases due to a decrease in power potential VDD or the like. Hence, latch circuit 100 can write data signal D1 to latch signal Q1.

As described above, latch circuit 100 according to this embodiment ensures the operation of writing to the latch circuit and the holding capability without any control function of interrupting or transmitting latch feedback signal B. Thus, the power consumption of the latch circuit can be reduced while ensuring the operation of writing to the latch circuit and the data holding capability.

Embodiment 4

Figure 4A:
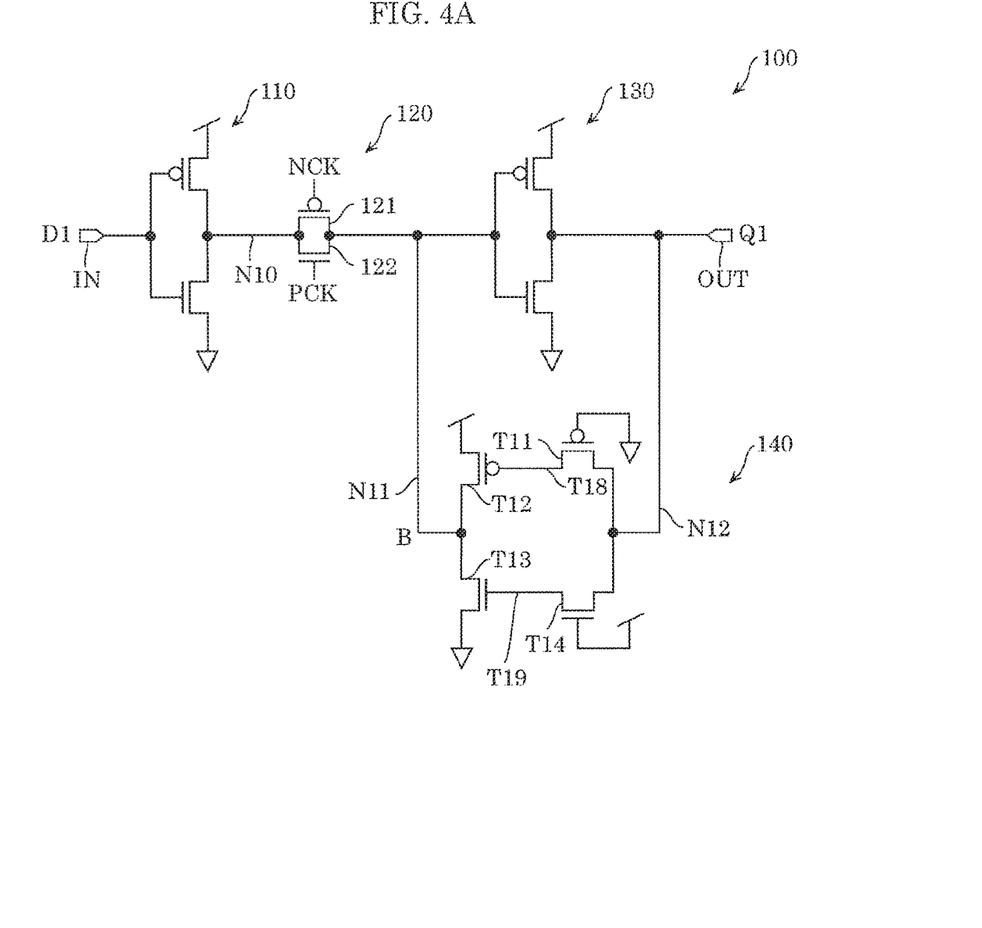
FIG. 4A is a conceptual diagram of a latch circuit according to Embodiment 4.
Figure 4B:
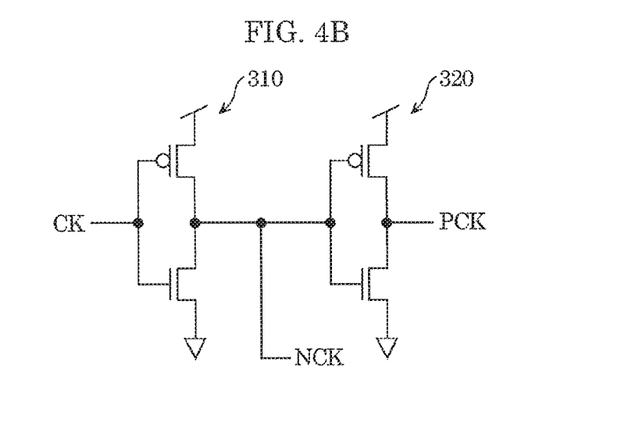
FIG. 4B is a conceptual diagram of a circuit that processes a clock signal in the latch circuit according to Embodiment 4.

FIG. 4A is a circuit diagram illustrating an example of a latch circuit according to Embodiment 4. In FIG. 4A, the structural elements other than latch feedback unit 140 are the same as or similar to those in FIG. 1A. FIG. 4B is a conceptual diagram of a circuit that processes a clock signal in the latch circuit according to Embodiment 4, and illustrates the same circuit as in FIG. 1B.

As illustrated in FIG. 4A, latch feedback unit 140 includes: P-type transistor T12 (first transistor) connected between the power (first potential node) and node N11 (first node); and N-type transistor T13 (second transistor) connected between node N11 and the ground (second potential node). P-type transistor T11 (third transistor) is connected between P-type transistor T12 and node N12 (second node), and has a gate to which ground potential VSS (third potential) is applied. N-type transistor T14 (fourth transistor) is connected between N-type transistor T13 (second transistor) and node N12 (second node), and has a gate to which power potential VDD (fourth potential) is applied. With such a structure, latch feedback unit 140 and inverter 130 realize a latch function, and latch circuit 100 receives data signal D1 from input terminal IN and outputs latch signal Q1 to output terminal OUT, as in FIG. 1A. Latch circuit 100 has no control switch for interrupting or transmitting latch feedback signal B.

The following describes the operation of latch circuit 100 according to Embodiment 4 in detail.

First, when clock signal CK is low, control switch 120 interrupts data signal D1. In this case, when latch signal Q1 is high and latch feedback signal B is low, P-type transistor T11 is on, P-type transistor T12 is off, and N-type transistor T14 is on. Accordingly, the potential obtained by decreasing (shifting) power potential VDD (first potential) by the threshold of N-type transistor T14 is applied to the gate of N-type transistor T13. This causes N-type transistor T13 to be weakly on, enabling latch feedback signal B and latch signal Q1 to be held.

Next, when clock signal CK transitions from low to high, control switch 120 transmits data signal D1. In this case, when data signal D1 transitions from high to low, the drive capability of N-type transistor T13 is sufficiently weak relative to inverter 110, so that latch feedback signal B can easily transition from low to high even if the drive capability of inverter 110 decreases due to a decrease in power potential VDD or the like. Hence, latch circuit 100 can write data signal D1 to latch signal Q1.

On the other hand, when latch signal Q1 is low and latch feedback signal B is high in the case where clock signal CK is low, N-type transistor T14 is on, N-type transistor T13 (second transistor) is off, and P-type transistor T11 is on. Accordingly, the potential obtained by decreasing (shifting) ground potential VSS (second potential) by the threshold of P-type transistor T11 is applied to the gate of P-type transistor T12. This causes P-type transistor T12 to be weakly on, enabling latch feedback signal B and latch signal Q1 to be held.

Next, when clock signal CK transitions from low to high, control switch 120 transmits data signal D1. In this case, when data signal D1 transitions from low to high, the drive capability of P-type transistor T12 is sufficiently weak relative to inverter 110, so that latch feedback signal B can easily transition from high to low even if the drive capability of inverter 110 decreases due to a decrease in power potential VDD or the like. Hence, latch circuit 100 can write data signal D1 to latch signal Q1.

Figure 5A:
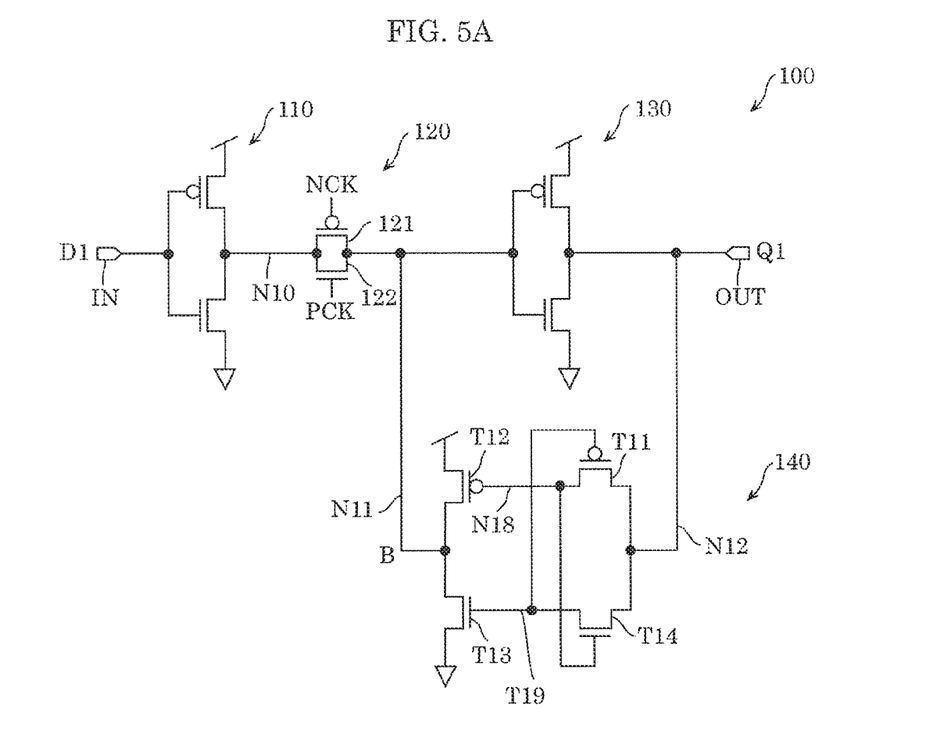
FIG. 5A is a diagram illustrating a variation of the latch circuit according to Embodiment 4.
Figure 5B:
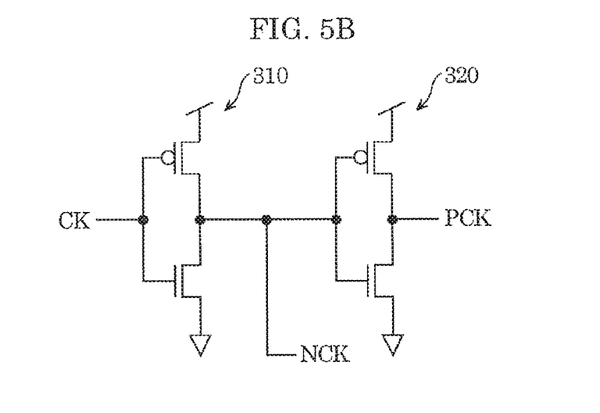
FIG. 5B is a conceptual diagram of a circuit that processes a clock signal in the variation of the latch circuit according to Embodiment 4.

Suppose the gate of P-type transistor T11 is connected to node N19 as a fourth node connecting the gate of N-type transistor T13 and N-type transistor T14, and the gate of N-type transistor T14 is connected to node N18 as a fifth node connecting the gate of P-type transistor T12 and P-type transistor T11, as illustrated in FIG. 5A. In this case, too, latch circuit 100 performs the same operation and produces the same advantageous effects as in FIG. 4A.

In other words, the semiconductor integrated circuit according to Embodiment 4 of the present disclosure is a semiconductor integrated circuit connected between a first node and a second node, and includes: a first transistor of a first conductivity type located between the first node and a first potential node to which a first potential is applied; a second transistor of a second conductivity type located between the first node and a second potential node to which a second potential is applied, and having a gate connected to the second node; and a third transistor of the first conductivity type located between a gate of the first transistor and the second node. When a signal at the second node changes to turn on the first transistor, a third potential for turning on the third transistor is applied to a gate of the third transistor, and a potential obtained by shifting the third potential by a threshold of the third transistor is applied to the gate of the first transistor.

According to Embodiment 4, when the signal at the second node changes (transitions from high to low or from low to high), the third potential (for example, the first potential in the case where the third transistor is of the second conductivity type, or the second potential in the case where the third transistor is of the first conductivity type) is applied to the gate of the third transistor, to turn on the third transistor. Then, the potential obtained by shifting, by the threshold of the third transistor, the third potential applied to the gate of the third transistor is applied to the gate of the first transistor. The application of the potential shifted by the threshold means that a predetermined potential between the first potential and the second potential is applied to the gate of the first transistor, so that the first transistor is weakly on. Since the first transistor is weakly on, the drive capability of the first transistor is sufficiently weak when the signal level at the first node transitions. This eases the transition of the signal level at the first node.

Therefore, in the case where the semiconductor integrated circuit according to Embodiment 4 is applied to, for example, a latch circuit or a flip-flop circuit, the first transistor is weakly on, and so the latch signal (output signal) and the signal fed back from the latch feedback unit can be held. Moreover, when the signal level at the first node transitions (from high to low or from low to high), the drive capability of the first transistor is sufficiently weak, which eases the transition of the signal level at the first node. This ensures the operation of writing to the latch circuit and the holding capability without any control function of interrupting or transmitting the signal fed back from the latch feedback unit. Thus, power consumption can be reduced while ensuring the operation of writing to the latch circuit or flip-flop circuit and the data holding capability.

Embodiment 5

Figure 6A:
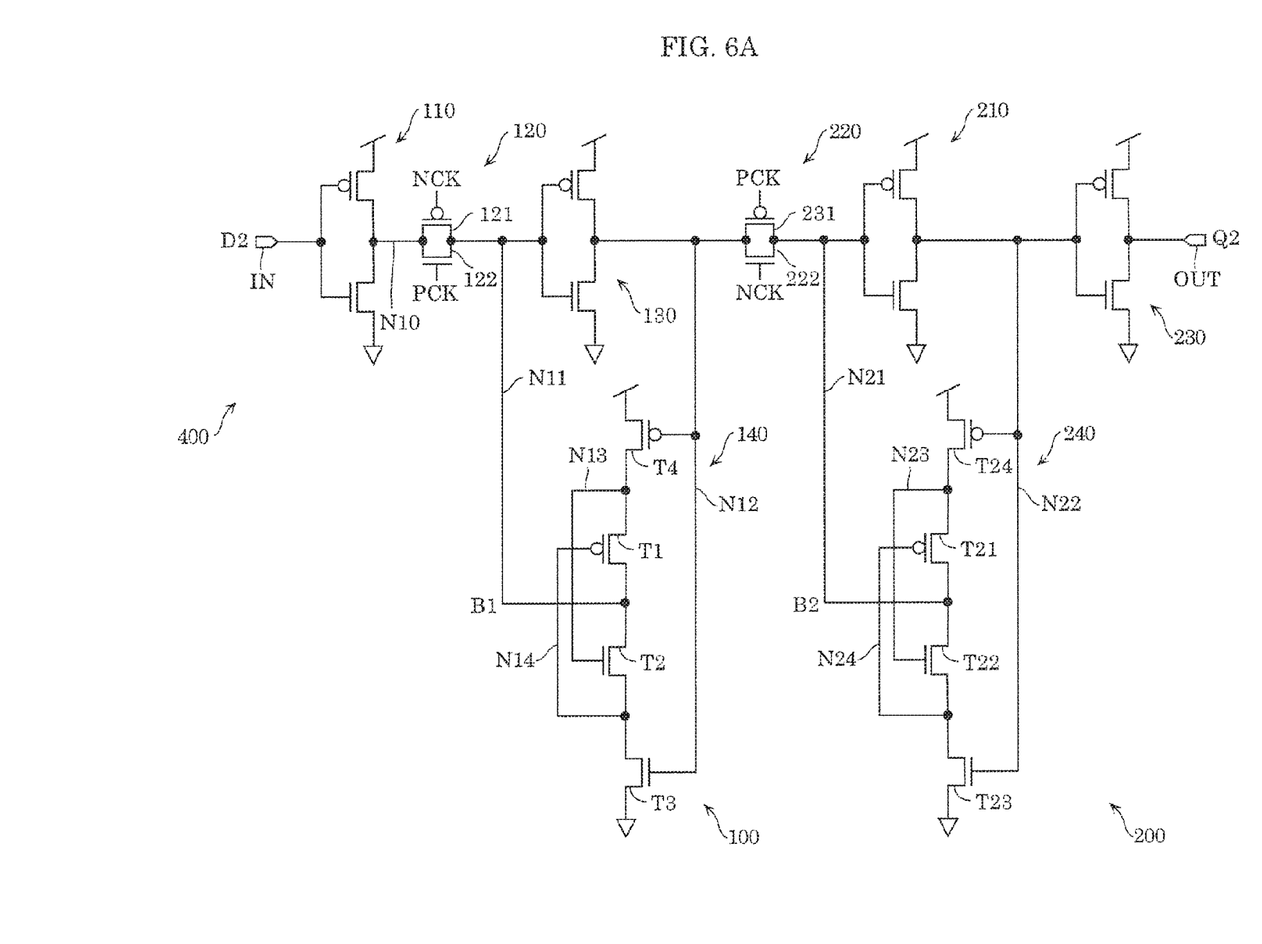
FIG. 6A is a conceptual diagram of a flip-flop circuit according to Embodiment 5.
Figure 6B:
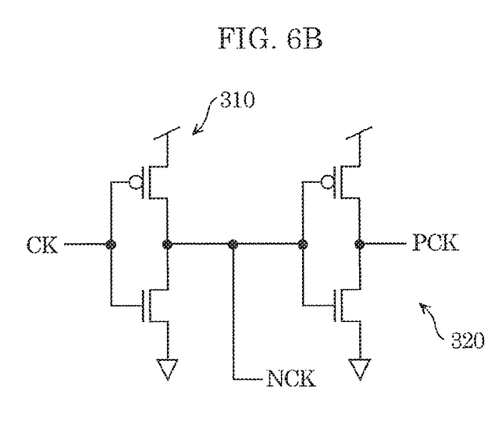
FIG. 6B is a conceptual diagram of a circuit that processes a clock signal in the flip-flop circuit according to Embodiment 5.

FIG. 6A is a circuit diagram illustrating an example of a flip-flop circuit according to Embodiment 5. FIG. 6B is a conceptual diagram of a circuit that processes a clock signal in the flip-flop circuit according to Embodiment 5, and illustrates the same circuit as in FIG. 1B.

As illustrated in FIG. 6A, flip-flop circuit 400 includes latch circuit 100 according to Embodiment 1 and latch circuit 200 connected in series between input terminal IN and output terminal OUT. As illustrated in FIG. 6B, inverters 310 and 320 generate clock internal signal PCK and clock internal inverted signal NCK, as in FIG. 1B.

Latch circuit 200 includes: control switch 220 that receives the output signal of latch circuit 100 at one end; two inverters 210 and 230 connected in series between the other end of control switch 220 and output terminal OUT; and latch feedback unit 240 (semiconductor integrated circuit) that receives the signal output from inverter 210, generates latch feedback signal B2, and feeds back latch feedback signal B2 to the input of inverter 210.

Latch feedback unit 240 has a structure same as or similar to latch feedback unit 140 in FIG. 1A. Latch feedback unit 240 includes: P-type transistors T24 (first transistor) and T21 (fourth transistor) connected in series between the power and node N21 to which latch feedback signal B2 is output; and N-type transistors T22 (second transistor) and T23 (third transistor) connected in series between node N21 (first node) and the ground (second potential).

In flip-flop circuit 400, inverter 130 and latch feedback unit 140 have a master latch function, control switch 220 has a function of interrupting or transmitting the signal of the master latch, inverter 210 and latch feedback unit 240 have a slave latch function, and inverter 230 outputs the output signal of the slave latch to output terminal OUT as flip-flop signal Q2. The operations of latch circuits 100 and 200 are the same as or similar to that of latch circuit 100 in Embodiment 1.

As described above, the use of the latch circuit according to Embodiment 1 in flip-flop circuit 400 ensures the operation of writing to the latch circuit and the holding capability without any control function of interrupting or transmitting latch feedback signal B1 in latch circuit 100 and latch feedback signal B2 in latch circuit 200. Thus, the power consumption of the flip-flop circuit (latch circuit) can be reduced while ensuring the operation of writing to the latch circuit and the data holding capability Embodiment 6

Figure 7:
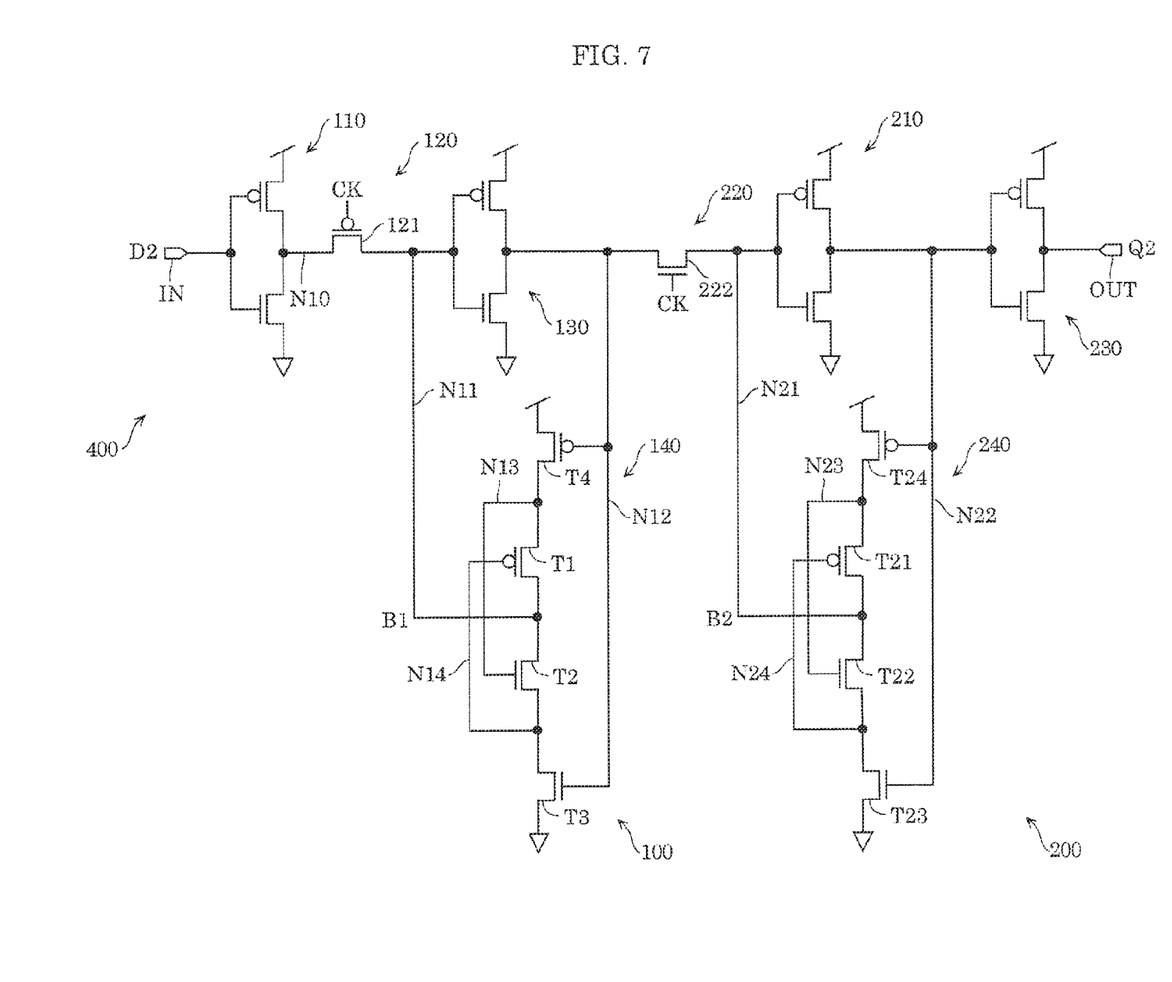
FIG. 7 is a conceptual diagram of a flip-flop circuit according to Embodiment 6.

FIG. 7 is a circuit diagram of flip-flop circuit 400 according to Embodiment 6. In FIG. 7, inverters 310 and 320 in FIG. 6B are omitted. Moreover, control switch 120 is composed of only P-type transistor 121, and control switch 220 is composed of only N-type transistor 222.

The operation of flip-flop circuit 400 according to Embodiment 6 is the same as or similar to that of flip-flop circuit 400 according to Embodiment 5 (FIGS. 6A and 6B). The flip-flop circuit according to this embodiment has fewer transistors and so achieves a further reduction in area or power consumption, while maintaining the advantageous effects of Embodiment 5.

Embodiment 7

Figure 8:
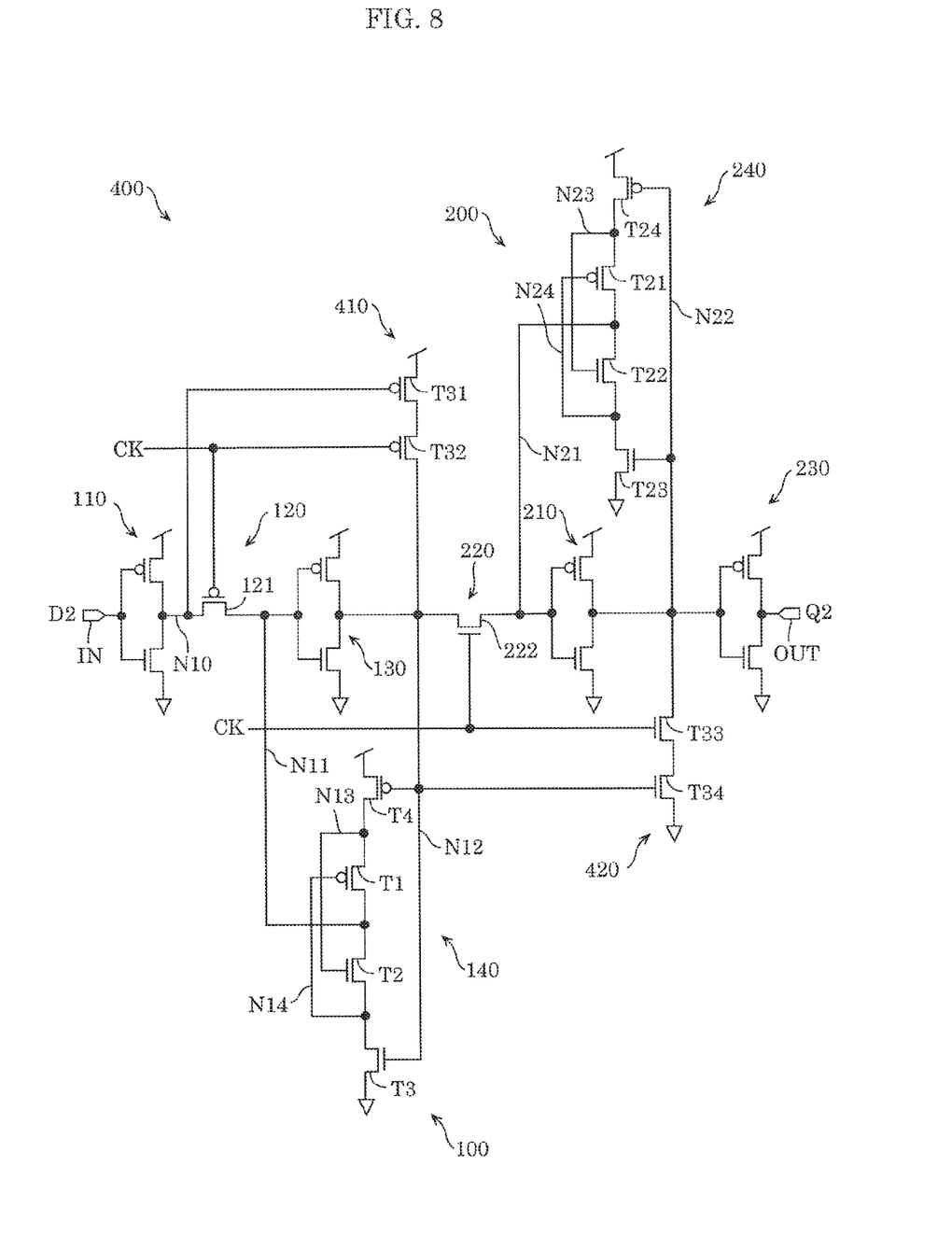
FIG. 8 is a conceptual diagram of a flip-flop circuit according to Embodiment 7.

FIG. 8 is a circuit diagram of flip-flop circuit 400 according to Embodiment 7. Flip-flop circuit 400 illustrated in FIG. 8 includes: auxiliary circuit 410 supporting the drive capability of inverter 130; and auxiliary circuit 420 supporting the drive capability of inverter 210.

Auxiliary circuit 410 includes P-type transistors T31 (seventh transistor) and T32 (eighth transistor). P-type transistor T31 has a source connected to the power, and a gate to which the output signal of inverter 110 is applied. P-type transistor T32 is connected between the drain of P-type transistor T31 and the output of inverter 130, and has a gate to which clock signal CK is applied. Auxiliary circuit 410 directly propagates the output signal of inverter 110 to the output signal of latch circuit 100 when control switch 120 transmits the output signal of inverter 110.

Auxiliary circuit 420 includes N-type transistors T33 (eighth transistor) and T34 (seventh transistor). N-type transistor T34 has a source connected to the ground, and a gate to which the output signal of inverter 130 is applied. N-type transistor T33 is connected between the drain of N-type transistor T34 and the output of inverter 210, and has a gate to which clock signal CK is applied. Auxiliary circuit 420 directly propagates the output signal of inverter 110 to the output signal of latch circuit 200 when control switch 120 transmits the output signal of inverter 110.

The operation of flip-flop circuit 400 according to Embodiment 7 is the same as or similar to that of flip-flop circuit 400 according to Embodiment 5 (FIGS. 6A and 6B). Thus, the flip-flop circuit according to this embodiment suppresses a decrease in drive capability and achieves a further reduction in power consumption, while maintaining the advantageous effects of Embodiment 5.

Embodiment 8

Figure 9:
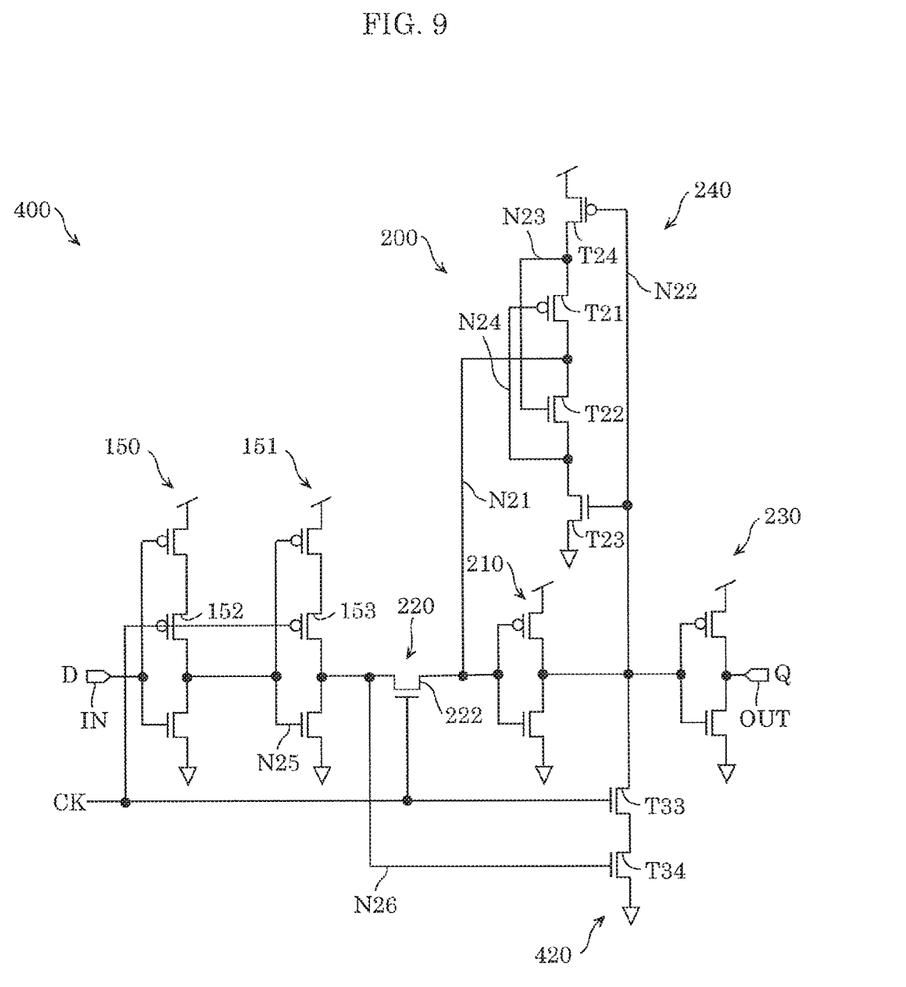
FIG. 9 is a conceptual diagram of a flip-flop circuit according to Embodiment 8.

FIG. 9 is a circuit diagram of flip-flop circuit 400 according to Embodiment 8. Flip-flop circuit 400 according to this embodiment has the same structure as the flip-flop circuit according to Embodiment 7 illustrated in FIG. 8. As illustrated in FIG. 9, flip-flop circuit 400 according to this embodiment includes latch feedback unit 240 and auxiliary circuit 420 as in FIG. 8, and includes, instead of the master latch (inverter 130 and latch feedback unit 140) in FIG. 8, a dynamic circuit including clocked inverters 150 and 151 using clock signal CK.

The dynamic circuit in this embodiment is the following circuit: Since the data holding function of the master is not a latch, when clock signal CK is high, P-type transistors 152 and 153 are off, which can cause nodes N25 and N26 to be floating. However, if the duration of clock signal CK being high is short, nodes N25 and N26 can hold the levels determined when clock signal CK was low immediately previously.

The dynamic circuit is not limited to that in Embodiment 8, and may have any structure that can realize the same function. The slave latch (inverter 210 and latch feedback unit 240) in flip-flop circuit 400 according to this embodiment may be any latch circuit (or slave latch) in Embodiments 1 to 7.

As described above, in flip-flop circuit 400 according to this embodiment, the slave latch is realized using any latch circuit in Embodiments 1 to 7, and the master latch is realized using the dynamic circuit with floating nodes. Thus, flip-flop circuit 400 according to this embodiment has fewer transistors and so achieves a further reduction in area or power consumption, while maintaining the advantageous effects of Embodiment 7.

While Embodiments 1 to 8 have been described above, any structural elements in these embodiments may be combined to form a new embodiment.

While Embodiments 1 to 4 describe one latch, two or more latches may be combined as a flip-flop as in Embodiments 5 to 8, to produce the same advantageous effects.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

A latch circuit or flip-flop circuit according to the present disclosure ensures stable operation even in the case where the power voltage decreases, and therefore is useful as, for example, a semiconductor integrated circuit installed in an electronic device such as a mobile device.

What is claimed is:

1. A semiconductor integrated circuit connected between a first node and a second node, the semiconductor integrated circuit comprising:
   a first transistor of a first conductivity type located between a first potential node to which a first potential is applied and the first node, and having a gate connected to the second node;
   a second transistor of a second conductivity type having a drain connected to the first node;
   a third transistor of the second conductivity type located between a third node connected to a source of the second transistor and a second potential node to which a second potential is applied, and having a gate connected to the second node;
   a fourth transistor of the first conductivity type having a source and a drain either one of which is connected to a gate of the second transistor, and a gate and the drain to both of which the second potential is applied;
   a fifth transistor of the first conductivity type located between a drain of the first transistor and the first node; and
   a sixth transistor of the second conductivity type having a gate and a drain to both of which the first potential is applied, and a source connected to a gate of the fifth transistor,
   wherein when a signal at the second node changes, a third potential for turning on the fourth transistor is applied to the gate of the fourth transistor, and a potential obtained by shifting the third potential by a threshold of the fourth transistor is applied to the gate of the second transistor.

2. A latch circuit comprising the semiconductor integrated circuit according to claim 1 as a latch feedback unit.

3. The latch circuit according to claim 2 that receives an input signal and a clock signal and outputs a latch signal, the latch circuit comprising:
   a first inverter that inverts the input signal and outputs the inverted input signal;
   a control switch that interrupts or transmits the output signal of the first inverter, based on the clock signal; and
   a second inverter that receives a signal output from the control switch, inverts the received signal, and outputs the inverted received signal as the latch signal,
   wherein the latch feedback unit is configured to receive the latch signal at the second node and feed back the latch signal to an input of the second inverter via the first node, and
   the control switch is composed of one transistor.

4. The latch circuit according to claim 3, further comprising:
- an auxiliary circuit including: a seventh transistor having a gate to which the output signal of the first inverter is applied; and an eighth transistor having a gate to which the clock signal is applied, and connected in series with the seventh transistor,
- wherein the auxiliary circuit directly propagates the output signal of the first inverter to an output signal of the latch circuit, when the control switch transmits the output signal of the first inverter.

5. A flip-flop circuit comprising the latch circuit according to claim 2.

* * * * *